United States Patent
Kang

(10) Patent No.: US 7,212,429 B2
(45) Date of Patent: May 1, 2007

(54) NONVOLATILE FERROELECTRIC MEMORY DEVICE

(75) Inventor: Hee Bok Kang, Daejeongwangyeok-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 87 days.

(21) Appl. No.: 11/057,192

(22) Filed: Feb. 15, 2005

(65) Prior Publication Data
US 2005/0231995 A1    Oct. 20, 2005

(30) Foreign Application Priority Data
Apr. 20, 2004   (KR) .................. 10-2004-0027068

(51) Int. Cl.
*G11C 11/22*    (2006.01)

(52) U.S. Cl. .................. 365/145; 365/207; 365/210

(58) Field of Classification Search ............ 365/145, 365/207, 210
See application file for complete search history.

(56) References Cited

U.S. PATENT DOCUMENTS

| | | | |
|---|---|---|---|
| 6,272,594 B1 | 8/2001 | Gupta et al. | |
| 6,363,439 B1 | 3/2002 | Battles et al. | |
| 6,574,135 B1* | 6/2003 | Komatsuzaki | 365/145 |
| 6,717,837 B2* | 4/2004 | Hasegawa et al. | 365/145 |
| 2005/0207203 A1* | 9/2005 | Kang | 365/145 |

FOREIGN PATENT DOCUMENTS

KR    19990080861    11/1999

* cited by examiner

*Primary Examiner*—David Lam
(74) *Attorney, Agent, or Firm*—Heller Ehrman LLP

(57) ABSTRACT

A nonvolatile ferroelectric memory device comprises a cell array block, a sense amplifier unit, a main amplifier unit and a data bus unit. The ferroelectric sense amplifier effectively senses and amplifies cell data having a small voltage difference applied to a main bit line, thereby improving operation characteristics in a low voltage. Also, a sensing voltage of the main bit line is lowered, thereby reducing a cross talk noise effect between main bit lines.

17 Claims, 8 Drawing Sheets

NONVOLATILE FERROELECTRIC MEMORY DEVICE

BACKGROUND ART

1. Field of the Invention

The present invention generally relates to a sense amplifier of a nonvolatile ferroelectric memory device, and more specifically, to a ferroelectric sense amplifier for effectively sensing and amplifying cell data having a small voltage difference applied to a main bit line, thereby improving operation characteristics in a low voltage.

2. Description of the Prior Art

Generally, a ferroelectric random access memory (hereinafter referred to as 'FeRAM') has a data processing speed as fast as a Dynamic Random Access Memory (hereinafter referred to as 'DRAM') and conserves data even after the power is turned off.

The FeRAM having structures similar to the DRAM includes the capacitors made of a ferroelectric substance so that it utilizes the characteristic of a high residual polarization of the ferroelectric substance in which data is not deleted even after an electric field is eliminated.

The technical contents on the above FeRAM are disclosed in Korean Patent Application No. 1999-14400 or a patent by the same inventor of the present invention. Therefore, the basic structure and the operation on the FeRAM are not described herein.

However, as the operating voltage of the FeRAM becomes lower and its power consumption also becomes lower, a cell sensing voltage is reduced, which results in difficulty in embodiment of rapid operation speed. As a result, a change is required in a method for sensing data. Additionally, as the structure of cell arrays becomes diverse, it also requires diverse methods for sensing data.

SUMMARY OF THE INVENTION

Accordingly, it is an object of the present invention to improve sensing and amplifying efficiency in a nonvolatile ferroelectric memory device driven in a low voltage by improving a structure of a sense amplifier to correspond to cell array characteristics.

In an embodiment, a nonvolatile ferroelectric memory device comprises a cell array block, a sense amplifier unit, a main amplifier unit and a data bus unit. The cell array block, which comprises a cell array having a hierarchical bit line architecture for varying a voltage level of a corresponding main bit line depending on cell data applied to a sub bit line to induce a sensing voltage to the corresponding main bit line, stores cell data. The sense amplifier unit comprises a plurality of sense amplifiers each for sensing a sensing voltage of the main bit line and variably regulating the amount of sensing load depending on the sensed voltage level to firstly amplify the sensing voltage and secondly amplify the firstly amplified sensing voltage compared with a reference voltage. The main amplifier unit amplifies data outputted from the sense amplifier unit to output the data to a data buffer. The data bus unit connects the sense amplifier units to the main amplifier unit to transmit read or written data.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
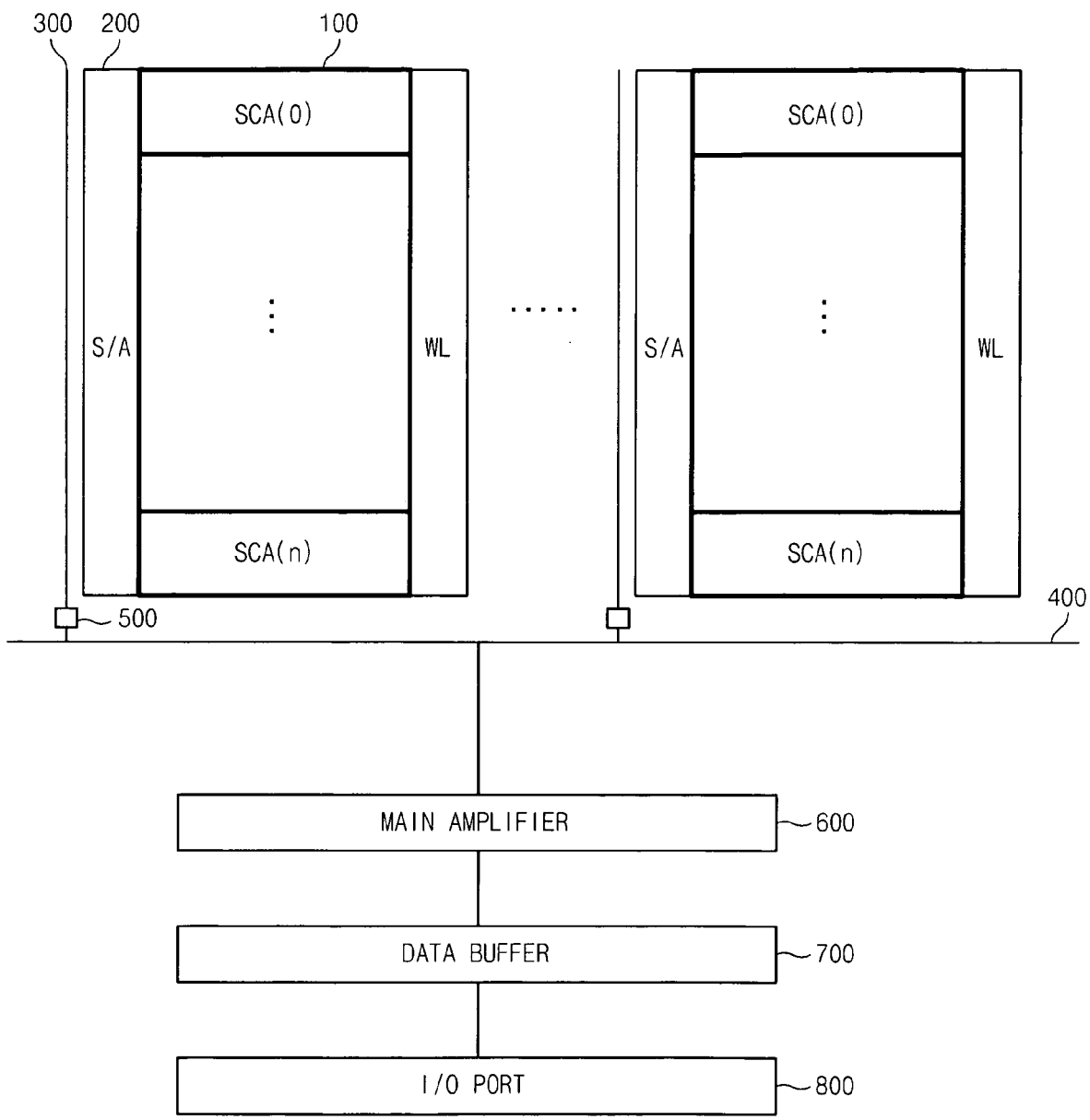
FIG. 1 is a diagram illustrating a structure of a nonvolatile ferroelectric memory device according to an embodiment of the present invention.

FIG. 1 is a diagram illustrating a structure of a nonvolatile ferroelectric memory device according to an embodiment of the present invention.

In an embodiment, a nonvolatile ferroelectric memory device comprises a plurality of cell array blocks 100, a plurality of sense amplifier units 200, a plurality of local data buses 300, a global data bus 400, a plurality of data bus switches 500, a main amplifier 600, a data buffer 700 and an I/O port 800.

The cell array block 100 comprises a plurality of sub cell arrays SCA(0)~SCA(n). Each of the sub cell arrays SCA(0)~SCA(n) comprises a cell array for storing data. The cell array block 100 which comprises a plurality of main bit lines and a plurality of sub bit lines varies the amount of current leaked from the main bit lines depending on cell data applied to the sub bit lines, thereby inducing sensing voltages of the main bit lines. Here, each of the sub cell arrays SCA(0)~SCA(n) has a folded bit line structure where cells connected to each sub bit line do not a word line with those connected to the adjacent sub bit lines or an open bit line where cells connected to each sub bit line share a word line with those connected to the adjacent sub bit line.

The sense amplifier unit 200 senses and amplifies a sensing voltage of the main bit line to selectively output the sensing voltage to the local data bus 300, and transmits write data applied through the local data bus 300 to the main bit line. The sense amplifier unit 200 is positioned between the cell array block 100 and the local data bus 300 to correspond one by one to the cell array block 100. That is, while a conventional sense amplifier senses cell data applied through a common data bus, the sense amplifier unit 200 according to an embodiment of the present invention directly senses the sensing voltage of the main bit line not through a common data bus. The sense amplifier unit 200 comprises a plurality of sense amplifiers each for sensing and amplifying the sensing voltage of the main bit line in the cell array block 100 to output the sensing voltage to the local data bus 300. Here, the sense amplifier, which is connected to the main bit line or a plurality of the main bit lines depending on the folded bit line or open bit line structure of the cell array, senses and amplifies the sensing voltage of the main bit line.

The local data bus 300 transmits a sensing voltage (read data) sensed in the sense amplifier unit 200 to the global data bus 400, and transmits a write data applied through the global data bus 400 to the sense amplifier unit 200. The local data bus 300 is positioned at one side of the sense amplifier unit 200 to correspond one by one to the cell array block 100. The local data bus 300 comprises the predetermined number of bus lines which corresponds to that of data simultaneously inputted or outputted by one column selection. Each local data bus 300 is selectively connected to the global data bus 400 depending on on/off operation of the data bus switch 500, and shares the global data bus 400.

The global data bus 400 transmits a read data applied from the local data bus 300 to the main amplifier 600, and transmits a write data applied from the main amplifier 600 to the local data bus 300. The global data bus 400 is selectively connected to one of a plurality of the local data buses 300 depending on the on/off operation of the data bus switch 500.

The main amplifier 600 amplifies read data applied from the global data bus 400 to transmit the read data to the data buffer 700, and amplifies write data applied through the data buffer 700 to transmit the write data to the global data bus 400.

The data buffer 700 buffers read data to be outputted externally, and then transmits the read data to the I/O port 800. Also, the data buffer 700 buffers write data to be externally inputted through the I/O port 800, and then transmits the write data to the main amplifier 600.

Figure 2:
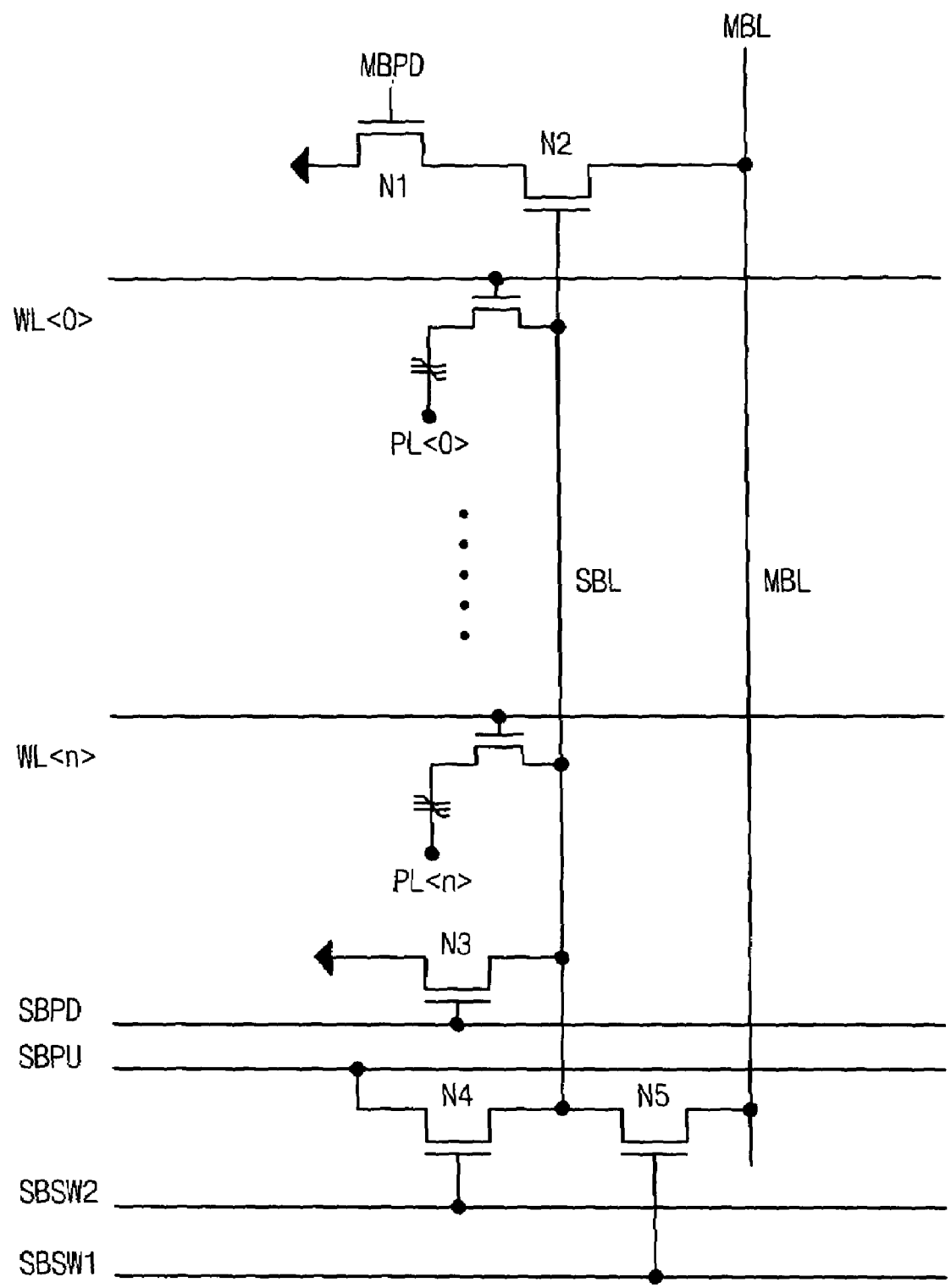
FIG. 2 is a circuit diagram illustrating one unit cell array in a sub cell array of a cell array block.

FIG. 2 is a circuit diagram illustrating one unit cell array SCA(0) in a sub cell array SCA(0)~SCA(n) of a cell array block 100 in FIG. 1.

Each of sub cell arrays SCA(0)~SCA(n) comprises one main bit line MBL which corresponds one by one to one sub bit line SBL in parallel.

When a sub bit line selecting signal SBSW1 is activated, a corresponding NMOS transistor N5 is turned on, so that load of the main bit line MBL is burdened to the level of one sub bit line. When a sub bit line pull-down signal SBPD is activated to turn on a NMOS transistor N3, the sub bit line SBL is regulated to a ground voltage level.

A sub bit line pull-up signal SBPU is to regulate a power to be supplied to the sub bit line SBL, and a sub bit line selecting signal SBSW2 is to regulate signal flowing between the sub bit line pull-up signal SBPU and the sub bit line SBL.

For example, when a high voltage is required in a low voltage, a voltage higher than a power voltage VCC is supplied to as the sub bit line pull-up signal SBPU. The sub bit line selecting signal SBSW2 is activated to turn on a NMOS transistor N4, a high voltage is supplied. Then, a plurality of cells are connected to the sub bit line SBL.

A NMOS transistor N1, connected between a ground voltage terminal and a NMOS transistor N2, has a gate to receive a main bit line pull-down signal MBPD. The NMOS transistor N2, connected between the NMOS transistor N1 and the main bit line MBL, has a gate connected to the sub bit line SBL. When the main bit line pull-down signal MBPD is activated, channel resistance of the NMOS transistor N2 is varied depending on cell data applied to the sub bit line SBL, thereby regulating the amount of current leaked from the main bit line MBL to induce a sensing voltage of the main bit line MBL.

Figure 3:
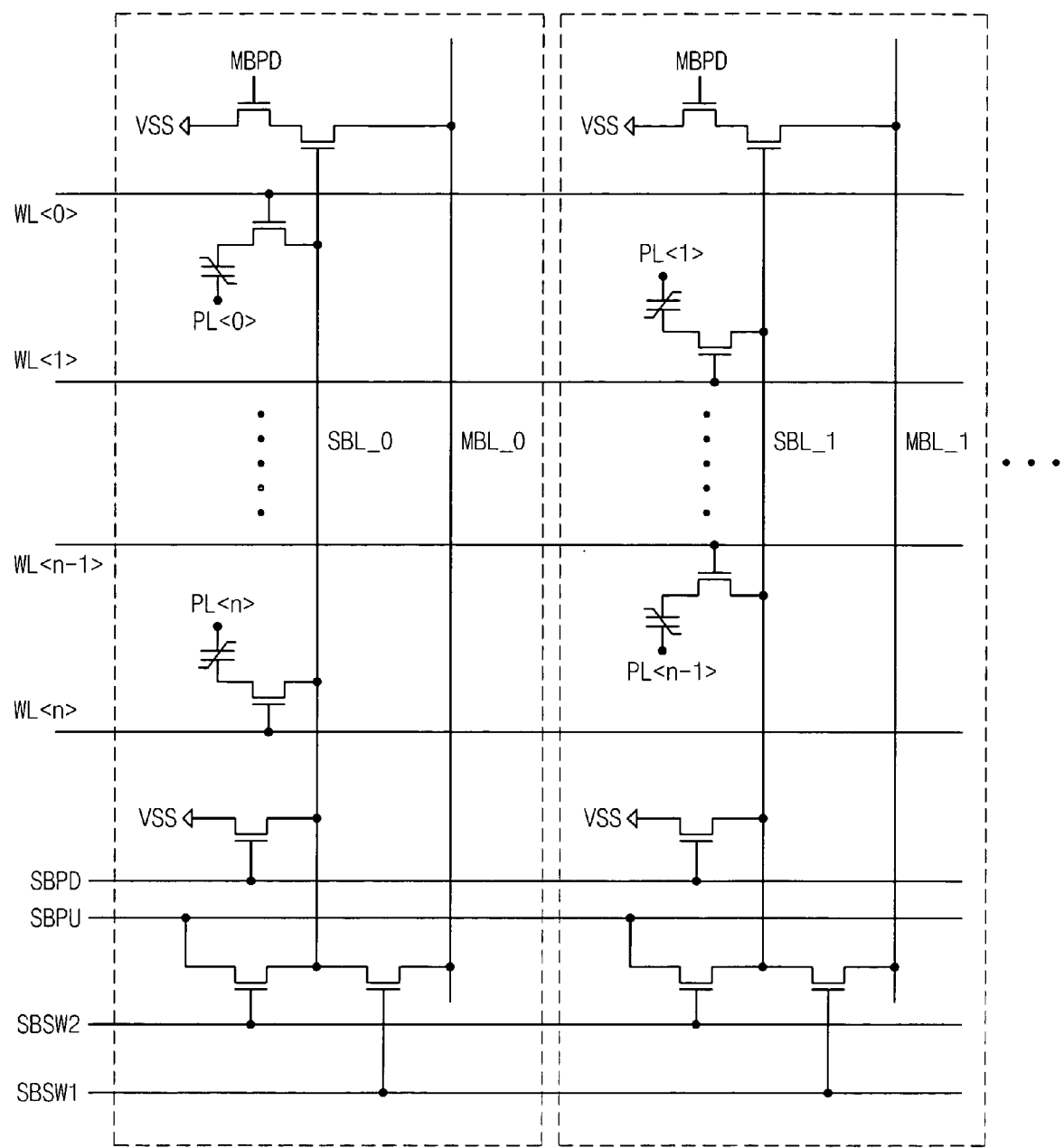
FIG. 3 is a circuit diagram illustrating a cell array structure according to a first embodiment of the present invention.

FIG. 3 is a circuit diagram illustrating a cell array structure according to a first embodiment of the present invention.

The cell array of FIG. 3 has a folded bit line structure where cells connected to the two sub bit lines SBL_0 and SBL_1 do not share word lines. That is, data of n bits are stored by using the two sub bit lines SBL_0 and SBL_1 corresponding to paired main bit lines MBL_0 and MBL_1 in the cell array of FIG. 3. As a result, each sense amplifier of the sense amplifier unit 200 is selectively connected to the paired main bit lines MBL_0 and MBL_1, and senses and amplifies cell data.

The same principle of FIG. 2 for inducing the sensing voltage to the main bit line MBL_0 or MBL_1 depending on data values of a selected cell is also applicable to the cell array of FIG. 3 when word lines WL<0>~WL<n> and plate lines PL<0>~PL<n> are activated.

Figure 4:
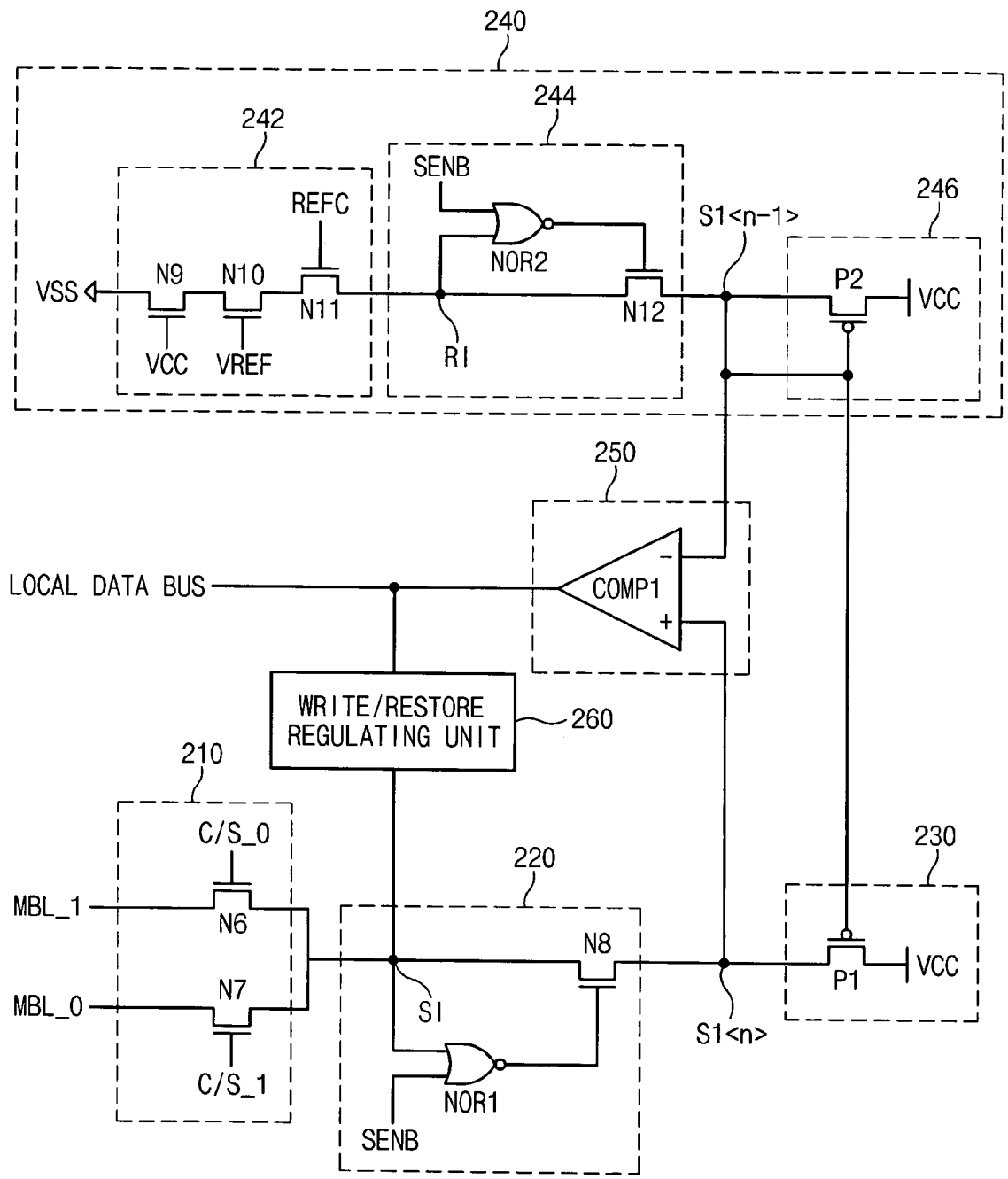
FIG. 4 is a circuit diagram illustrating a sense amplifier for sensing and amplifying a sensing voltage of each main bit line in the cell array of FIG. 3.

FIG. 4 is a circuit diagram illustrating a sense amplifier for sensing and amplifying a sensing voltage of each main bit line in the cell array of FIG. 3.

The sense amplifier of FIG. 4 comprises a column selecting unit 210, a MBL sensing unit 220, a sensing load unit 230, a reference voltage generating unit 240, a comparison amplification unit 250 and a write/restore regulating unit 260.

The column selecting unit 210 selectively connects one of the paired main bit lines MBL_0 and MBL_1 to the MBL sensing unit 220 in response to column selecting signals C/S_0 and C/S_1, and applies a voltage of the selected main bit line MBL_0 or MBL_1 to the MBL sensing unit 220. The column selecting unit 210 comprises NMOS transistors N6 and N7. The NMOS transistor N6, connected between the main bit line MBL_0 and the MBL sensing unit 220, has a gate to receive the column selecting signal C/S_0 while the NMOS transistor N7, connected between the main bit line MBL_1 and the MBL sensing unit 220, has a gate to receive the column selecting signal C/S_1.

The MBL sensing unit 220 senses and amplifies the voltage of the main bit line MBL_0 or MBL_1 selected in the column selecting unit 210 in response to a sensing signal SENB. Here, the MBL sensing unit 220 inverts and amplifies the voltage of the selected main bit line MBL_0 or MBL_1 when the sensing signal SENB is activated ("LOW"), and then regulates the amplification degree of an output voltage depending on a level of the inverted and amplified voltage. The MBL sensing unit 220 comprises a NOR gate NOR1 and a NMOS transistor N8. The NOR gate NOR1 performs a NOR operation on the sensing signal SENB and an output signal of the column selecting unit 210. The NMOS transistor N8, connected between nodes S1<n> and SI, has a gate to receive an output signal from the NOR gate NOR1.

The sensing load unit 230 regulates sensing load of the MBL sensing unit 220 depending on an output voltage (reference voltage) of the reference voltage generating unit 240. The sensing load unit 230 comprises a PMOS transistor P1 which is connected between a power voltage VCC terminal and the node S1<n> and has a gate to the reference voltage. That is, channel resistance of the PMOS transistor P1 is varied depending on the reference voltage, so that the sensing load unit 230 regulates the amount of current applied from the power voltage terminal VCC to the node S1<n> to control the sensing load.

The reference voltage generating unit 240 generates the reference voltage in response to a reference voltage regulating signal VREF when a reference voltage column selecting signal REFC is activated. The reference voltage generating unit 240 comprises a reference current regulating unit 242, a reference voltage sensing unit 244 and a sensing load unit 246.

The reference current regulating unit 242 regulates current leakage of the reference voltage generating unit 240 in response to the reference voltage regulating signal VREF, and variably induces generation of the reference voltage. The reference current regulating unit 242 comprises NMOS transistors N9, N10 and N11 which are connected between a node RI and a ground voltage terminal VSS. The NMOS transistors N9, N10 and N11 have gates to receive a power voltage VCC, the reference voltage regulating signal VREF and the reference voltage column selecting signal REFC, respectively.

Here, the NMOS transistors N9 and N10 perform the same operation as those of the NMOS transistors N1 and N2 for inducing the sensing voltage of the main bit line MBL in the cell array, respectively. In other words, the reference current regulating unit 242 regulates channel resistance of the NMOS transistor N10 depending on a voltage level of the reference voltage regulating signal VREF, and controls the amount of current leaked through the reference current regulating unit 242, thereby inducing generation of the reference voltage.

The reference voltage sensing unit 244 senses and amplifies an output voltage of the reference current regulating unit 242 in response to the sensing signal SENB. Here, the reference voltage sensing unit 244 inverts and amplifies an output voltage of the reference current regulating unit 242 when the sensing signal SENB is activated ("LOW"), and regulates an output level of the output voltage (reference voltage) depending on the level of the inverted and amplified voltage. The reference voltage sensing unit 244 comprises a NOR gate NOR2 and a NMOS transistor N12. The NOR gate NOR2 performs a NOR operation on the sensing signal SENB and a signal of the node RI. The NMOS transistor N25, connected between nodes S1<n−1> and RI, has a gate to receive an output signal from the NOR gate NOR2.

The sensing load unit 246 regulates sensing load of the reference voltage sensing unit 244 depending on the output voltage (reference voltage) of the reference voltage generating unit 240. The sensing load unit 246 comprises a PMOS transistor P2 which is connected between the power voltage VCC terminal and the node S1>n−1> and has a gate to receive the reference voltage. That is, channel resistance of the PMOS transistor P2 is varied depending on the reference voltage, so that the sensing load unit 246 regulates the amount of current applied from the power voltage terminal VCC to the node S1<n−1> to control the sensing load.

The comparison amplification unit 250 compares output voltages of the MBL sensing unit 220 and the reference voltage generating unit 240, and amplifies data sensed in the MBL sensing unit 220 to output the data to the local data bus 300. The comparison amplification unit 250 comprises a comparator COMP1 for receiving output signals from the MBL sensing unit 220 and the reference voltage generating unit 240.

The write/restore regulating unit 260 transmits write data and read data applied to the local data bus 300 to the column selecting unit 210.

Figure 5:
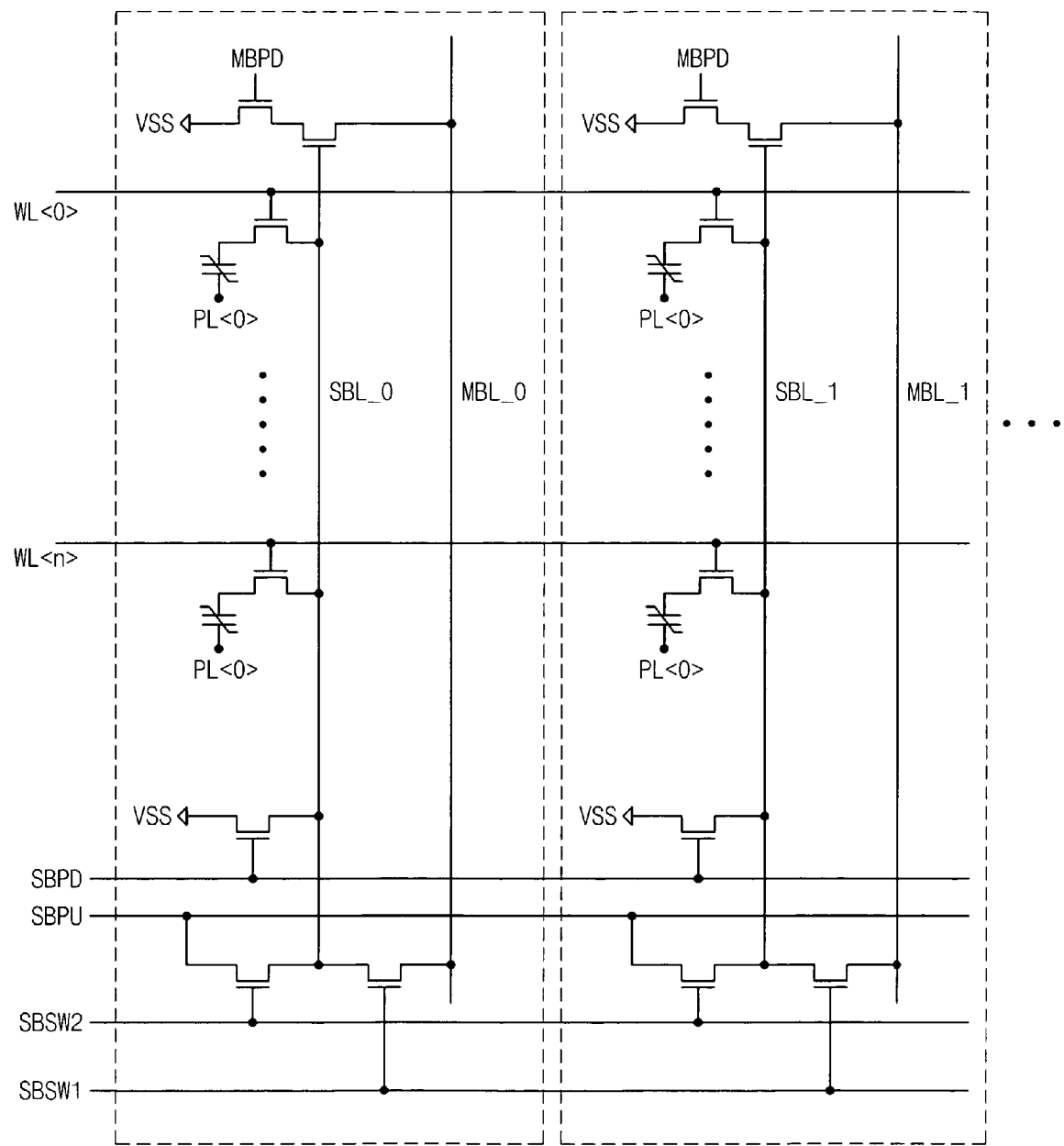
FIG. 5 is a circuit diagram illustrating a cell array structure according to a second embodiment of the present invention.

FIG. 5 is a circuit diagram illustrating a cell array structure according to a second embodiment of the present invention.

The cell array of FIG. 5 has a open bit line structure where cells connected to the two sub bit lines SBL_0 and SBL_1 share word lines. That is, data of n bits are stored in the two sub bit lines SBL_0, SBL_1 and . . . in the cell array of FIG. 5. As a result, each sense amplifier of the sense amplifier unit 200 is connected one by one to the main bit lines, and selectively connected to the corresponding main bit line to sense and amplify cell data.

The same principle of FIG. 2 for inducing the sensing voltage to the main bit line MBL_0 or MBL_1 depending on data values of a selected cell is also applicable to the cell array of FIG. 5 when word lines WL<0>~WL<n> and plate lines PL<0>~PL<n> are activated.

Figure 6:
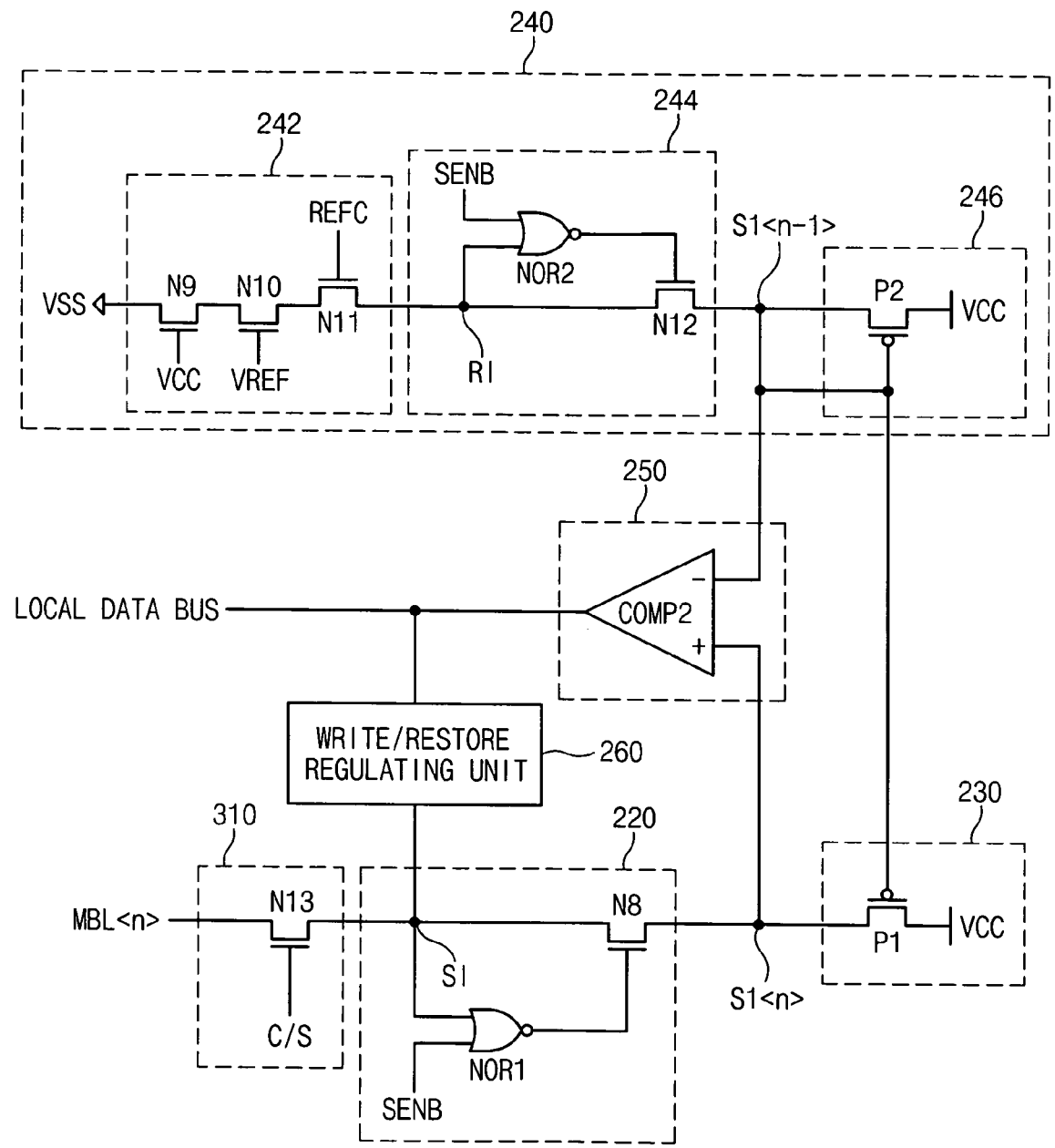
FIG. 6 is a circuit diagram illustrating a sense amplifier for sensing and amplifying a sensing voltage of each main bit line in the cell array of FIG. 5.

FIG. 6 is a circuit diagram illustrating a sense amplifier for sensing and amplifying a sensing voltage of each main bit line in the cell array of FIG. 5.

The sense amplifier of FIG. 6 is different from that of FIG. 4 only in the configuration of a column selecting unit 310. That is, the sense amplifier of FIG. 6 is configured to sense and amplify the sensing voltage of the main bit line corresponding one by one to the sense amplifier.

The column selecting unit 310 selectively connects the MBL sensing unit 220 to the main bit line MBL<n> in response to the column selecting signal C/S, and applies the voltage of the main bit line MBL<n> to the MBL sensing unit 220. The column selecting unit 310 comprises a NMOS transistor N13 which is connected between the main bit line MBL<n> and the MBL sensing unit 220 and has a gate to receive the column selecting signal C/S.

Since the structure and function of FIG. 6 are the same as those of FIG. 4, the same reference numerals of FIG. 4 are used in FIG. 6. and the detailed explanation is omitted.

Figure 7:
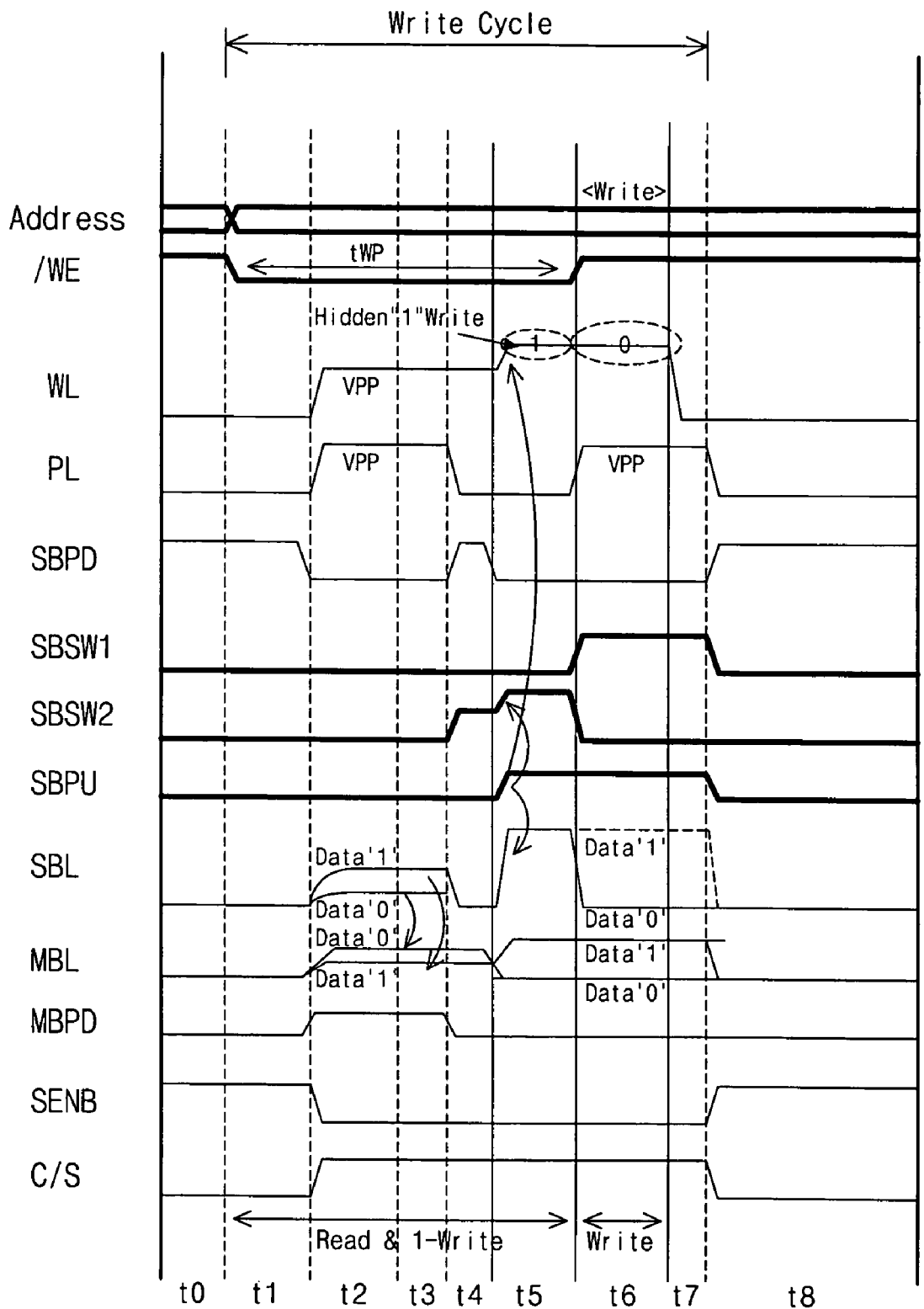
FIG. 7 is a timing diagram illustrating the write operation of the nonvolatile ferroelectric memory device according to an embodiment of the present invention.

FIG. 7 is a timing diagram illustrating the write operation of the nonvolatile ferroelectric memory device according to an embodiment of the present invention.

In a period t1, when an address is transited and a write enable signal /WE is inactivated to 'low', the operation becomes at a write mode active state.

Before the word line WL is activated, the main bit line MBL and the sub bit line SBL are pulled down. During a precharge mode, the main bit line MBL is maintained at a low level, thereby preventing current leakage by the NMOS transistors connected to the main bit line MBL to reduce standby current.

In periods t2 and t3, data are sensed. In the period t2, when the word line WL and the plate line PL are enabled to 'high', data of the cell selected by the enabled word line WL are applied to the sub bit line SBL. In the above-described first embodiment, cell data are applied to one of the sub bit lines SBL_0 and SBL_1.

When the cell data are applied to the sub bit line SBL_L while the main bit line MBPD is activated, the NMOS transistor N2 is turned on, so that the sensing voltage is induced to the main bit line MBL. Here, since the amount of current leaked through the NMOS transistor N2 is differentiated depending on the cell data, the sensing voltage having a different level is induced to the main bit line MBL depending on the cell data.

The sensing voltage induced to the main bit line MBL is applied to the sense amplifier through the column selecting unit 210 or 310 in response to the column selecting signal C/S (C/S_0 or C/S_1 in the first embodiment), and then sensed and amplified by the sense amplifier. After the MBL sensing unit 220 inverts and amplifies the voltage of the main bit line MBL, the voltage is applied to the NMOS transistor N8. As a result, the amount of current flowing through the NMOS transistor N8 is regulated depending on the cell data, and the voltage of the main bit line MBL is firstly amplified.

That is, channel resistance of the NMOS transistor N8 is configured to be larger when the cell data is "0" than when the cell data is "1". As a result, the amount of current flowing through the NMOS transistor N8 is reduced, and the voltage level of the node S1<n> becomes higher. On the other hand, the channel resistance of the NMOS transistor N8 is configured to be smaller when the cell data is "1" than when the cell data is "0". As a result, the amount of current flowing through the NMOS transistor N8 is becomes larger, and the voltage level of the node S1<n> becomes lower. Therefore, the voltage difference between data 'high' and 'low' in the node S1<n> is amplified larger than that in the main bit line MBL.

When the sensing signal SENB is activated to 'low', the reference voltage generating unit 240 inverts and amplifies a voltage induced by the reference current regulating unit 242, and regulates the level of the reference voltage with the inverted and amplified voltage to output the level to the comparison and amplification unit 250. In the reference current regulating unit 242, when the reference voltage column selecting signal REFC is activated, channel resistance of the NMOS transistor N10 is activated is regulated in response to the reference voltage regulating signal VREF, thereby controlling current leakage of the reference voltage generating unit 240 to induce generation of the reference voltage.

Here, the NMOS transistors N9 and N10 perform the same operations as those of the NMOS transistors N1 and N2 for inducing the sensing voltage of the main bit line MBL from the cell arrays, respectively, thereby inducing generation of the reference voltage. Then, the reference voltage sensing unit 244 and the sensing load unit 246 regulate the level of the reference voltage through the same principle as that in the MBL sensing unit 220 and the sensing load unit 230, respectively.

The voltage firstly amplified in the MBL sensing unit 220 is compared with the reference voltage in the comparison amplification unit 250 and secondly amplified to be outputted to the local data bus 300.

After the sensing operation is completed, a voltage of the plate line PL is inactivated to 'low' in a period t4, and the sub bit line pull-down signal SBPD is activated to 'high', so that the sub bit line SBL is regulated to the ground level.

Next, when the sub bit line pull-up signal SBPU is activated in a period t5, high data (Hidden "1") is written in all cells connected to the driven word line WL regardless of external data.

In a period t6, the write enable signal/WE is activated to 'high', data are written. That is, the voltages of the word line WL and the plate line PL are changed to the pumping level, and write data applied to the local data bus 300 are applied to the main bit line MBL (MBL_0 or MBL_1 in the first embodiment) through the column selecting unit 210 or 310 by the write/restore regulating unit 260.

The write data applied to the main bit line MBL are applied to the sub bit line SBL by activation of the sub bit line selecting signal SBSW1, and written in the cell. Here, the data written in the period t5 is maintained as it is when the data applied to the sub bit line SBL is 'high' while low data is written in the corresponding cell when the data of the sub bit line SBL is 'low'. That is, external low data ("0") is written in the cell in the period t6.

After the data are completely written, the word line WL is inactivated for a predetermined time earlier than the plate line PL.

Figure 8:
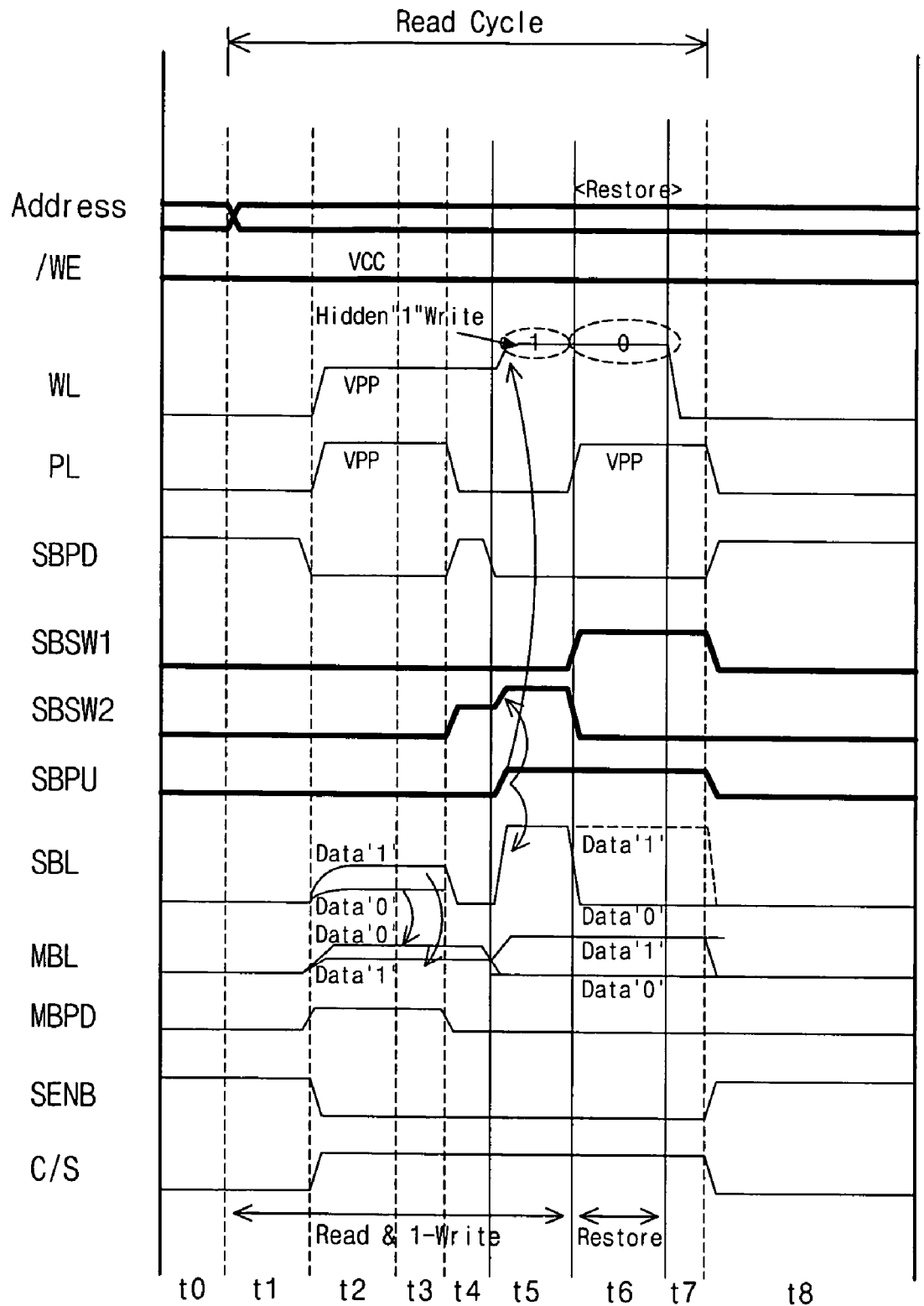
FIG. 8 is a timing diagram illustrating the read operation of the nonvolatile ferroelectric memory device according to an embodiment of the present invention.

FIG. 8 is a timing diagram illustrating the read operation of the nonvolatile ferroelectric memory device according to an embodiment of the present invention.

At the read mode, the write enable signal/WE is maintained at the power voltage VCC level.

The same operation for sensing and amplifying cell data and writing the hidden data "1" in the corresponding cell during the periods t0~t5 in FIG. 7 is also applied to periods t0~t5 in FIG. 8.

After the sensing and amplification are completed, the output signal (read data) of the comparison and amplification unit 250 is applied to the main bit line MBL through the write/restore regulating unit 260 and the column selecting unit 210 or 310.

In a period t6, when the voltages of the word line WL and the plate line PL are changed to the pumping level and the sub bit line selecting signal SBSW1 is activated, the read data applied to the main bit line MBL is applied to the sub bit lines SBL, and restored in the corresponding cell. Here, the data written in the period t5 is maintained as it is when the data of the sub bit line SBL is 'high' while the low data is written in the corresponding cell when the data of the sub bit line SBL is 'low'. Therefore, the period t6 is a restore period where the internally sensed and amplified data is re-written in the cell.

After the restore operation is completed, the word line WL is inactivated for a predetermined time earlier than the plate line PL.

As described above, a ferroelectric sense amplifier according to an embodiment of the present invention effectively senses and amplifies cell data having a small voltage difference applied to a main bit line, thereby improving operation characteristics in a nonvolatile ferroelectric memory device driven in a low voltage. Also, a sensing voltage of the main bit line is lowered, thereby reducing a cross talk noise effect between main bit lines, and a sensing load is comprised in the sense amplifier, thereby reducing current of the sense amplifier.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric memory device comprising:
a cell array block, comprising a cell array having a hierarchical bit line architecture for varying a voltage level of a corresponding main bit line depending on cell data applied to a sub bit line to induce a sensing voltage to the corresponding main bit line;
sense amplifier unit comprising a plurality of sense amplifiers each for sensing a sensing voltage of the main bit line and variably regulating the amount of sensing load depending on the sensed voltage level to firstly amplify the sensing voltage and secondly amplify the firstly amplified sensing voltage compared with a reference voltage;
a main amplifier unit for amplifying data outputted from the sense amplifier unit to output the data to a data buffer; and
a data bus unit for connecting the sense amplifier units to the main amplifier unit to transmit read or written data.

2. The nonvolatile ferroelectric memory device according to claim 1, wherein the cell array block has a folded bit line cell array structure where unit cells connected to adjacent sub bit lines do not share a word line.

3. The nonvolatile ferroelectric memory device according to claim 2, wherein the sense amplifier is selectively connected to two main bit lines corresponding to the two adjacent sub bit lines, and senses and amplifies the sensing voltage of the corresponding main bit line.

4. The nonvolatile ferroelectric memory device according to claim 3, wherein the sense amplifier comprises:
   a column selecting unit, connected to the two main bit lines, for selectively transmitting one of the sensing voltages of the two main bit lines in response to the column selecting signal;
   a MBL sensing unit, when a sensing signal is activated, for sensing the sensing voltage of the main bit line transmitted through the column selecting unit and variably regulating the amount of sensing load applied depending on the sensed voltage level;
   a first sensing load unit for applying the sensing load to the MBL sensing unit and regulating the amount of load applied depending on a reference voltage;
   a reference voltage generating unit for generating the reference voltage in response to a reference voltage regulating signal when a reference voltage column selecting signal is activated;
   a comparison and amplification unit for comparing output voltages of the MBL sensing unit and the reference voltage generating unit and amplifying the output voltage of the MBL sensing unit to output the output voltage to the local data bus; and
   a write/restore regulating unit for transmitting write/read data applied to the local data bus to the column selecting unit.

5. The nonvolatile ferroelectric memory device according to claim 4, wherein the MBL sensing unit inverts and amplifies the sensing voltage, and varies channel resistance of a switching means connected between output nodes of the column selecting unit and the first sensing load unit depending on a level of the inverted and amplified voltage to regulate the amount of sensing load.

6. The nonvolatile ferroelectric memory device according to claim 5, wherein the first sensing load unit varies channel resistance of a switching means connected between a power voltage terminal and an output node of the MBL sensing unit depending on the reference voltage to regulate the sensing load applied to the MBL sensing unit.

7. The nonvolatile ferroelectric memory device according to claim 6, wherein the reference voltage generating unit comprises:
   a reference current regulating unit for regulating current leakage of the reference voltage generating unit in response to the reference voltage regulating signal to variably induce generation of the reference voltage;
   a reference voltage sensing unit, when the sensing signal is activated, for sensing an output voltage of the reference current regulating unit and variably regulating the amount of sensing load applied depending on the sensed voltage level to output the reference voltage; and
   a second sensing load unit for applying the sensing load to the reference voltage sensing unit and regulating the amount of load applied depending on the reference voltage.

8. The nonvolatile ferroelectric memory device, according to claim 7, wherein the reference voltage sensing unit inverts and amplifies and output voltage of the reference current regulating unit, and varies channel resistance of a switching means connected between output nodes of the reference current regulating unit and the second sensing load unit depending on a level of the inverted and amplified voltage to regulate the amount of the sensing load.

9. The nonvolatile ferroelectric memory device according to claim 8, wherein the second sensing load unit varies channel resistance of a switching means connected between a power voltage terminal and an output node of the reference voltage sensing unit depending on the reference voltage, and regulates the amount of the sensing load applied to the reference voltage sensing unit.

10. The nonvolatile ferroelectric memory device according to claim 8, wherein the second sensing load unit varies channel resistance of a switching means connected between a power voltage terminal and an output node of the reference voltage sensing unit depending on the reference voltage, and regulates the amount of sensing load applied to the reference voltage sensing unit.

11. The nonvolatile ferroelectric memory device according to claim 10, wherein each of the sense amplifiers which are positioned one by one to each of the main bit lines and selectively connected to the corresponding main bit line in response to a column selecting signal to sense and amplify the sensing voltage of the corresponding main bit line.

12. The nonvolatile ferroelectric memory device according to claim 11, wherein the sense amplifier comprises:
   a column selecting unit, connected one by one to the main bit line, for selectively transmitting the sensing voltage of the corresponding main bit line in response to the column selecting signal;
   a MBL sensing unit, when a sensing signal is activated, for sensing the sensing voltage of the main bit line transmitted through the column selecting unit and variably regulating the amount of sensing load applied depending on the sensed voltage level to amplify the sensing voltage;
   a first sensing load unit for applying the sensing load to the MBL sensing unit to regulating the amount of load applied depending on a reference voltage;
   a reference voltage generating unit for generating the reference voltage in response to a reference voltage regulating signal when a reference voltage column selecting signal is activated;
   a comparison amplification unit for comparing output voltages of the MBL sensing unit and the reference voltage generating unit and amplifying the output voltage of the MBL sensing unit to output the amplified output voltage to the local data bus; and
   a write/restore regulating unit for transmitting write/read data applied to the local data bus to the column selecting unit.

13. The nonvolatile ferroelectric memory device according to claim 12, wherein the MBL sensing unit inverts and amplifies the sensing voltage, and varies channel resistance of a switching means connected between output nodes of the column selecting unit and the first sensing load unit depending on a level of the inverted and amplified voltage to regulate the amount of sensing load.

14. The nonvolatile ferroelectric memory device according to claim 13, wherein the first sensing load unit varies channel resistance of a switching means connected between a power voltage terminal and an output node of the MBL sensing unit depending on the reference voltage to regulate the amount of sensing load applied to the MBL sensing unit.

15. The nonvolatile ferroelectric memory device according to claim 14, wherein the reference voltage generating unit comprises:
   a reference current regulating unit for regulating current leakage of the reference voltage generating unit in response to the reference voltage regulating signal to variably induce generation of the reference voltage;

a reference voltage sensing unit, when the sensing signal is activated, for sensing an output voltage of the reference current regulating unit and variably regulating the amount of sensing load applied depending on the sensed voltage level to output the reference voltage; and a second sensing load unit for applying the sensing load to the reference voltage sensing unit and regulating the amount of load applied depending on the reference voltage.

16. The nonvolatile ferroelectric memory device according to claim 15, wherein the reference voltage sensing unit inverts and amplifies an output voltage of the reference current regulating unit, and varies channel resistance of a switching means connected between output nodes of the reference current regulating unit and the second sensing load unit depending on a level of the inverted and amplified voltage to regulate the amount of sensing load.

17. The nonvolatile ferroelectric memory device according to claim 16, wherein the second sensing load unit varies channel resistance of a switching means connected between a power voltage terminal and an output node of the reference voltage sensing unit depending on the reference voltage, and regulates the amount of sensing load applied to the reference voltage sensing unit.

* * * * *